US010777638B1

(12) United States Patent
Wong et al.

(10) Patent No.: US 10,777,638 B1
(45) Date of Patent: Sep. 15, 2020

(54) CONSTRICTED JUNCTIONLESS FINFET/NANOWIRE/NANOSHEET DEVICE HAVING CASCODE PORTION

(71) Applicant: Synopsys, Inc., Mountain View, CA (US)

(72) Inventors: Hiu Yung Wong, Cupertino, CA (US); Nelson de Almeida Braga, San Diego, CA (US); Rimvydas Mickevicius, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/239,403

(22) Filed: Jan. 3, 2019

Related U.S. Application Data

(60) Provisional application No. 62/613,596, filed on Jan. 4, 2018.

(51) Int. Cl.
*H01L 29/06* (2006.01)
*H01L 29/78* (2006.01)
(Continued)

(52) U.S. Cl.
CPC ...... *H01L 29/068* (2013.01); *H01L 29/41791* (2013.01); *H01L 29/66795* (2013.01);
(Continued)

(58) Field of Classification Search
CPC ............ H01L 29/068; H01L 29/41791; H01L 29/66795; H01L 29/785; H01L 29/778; H01L 29/7787; H01L 29/8128
See application file for complete search history.

(56) References Cited

U.S. PATENT DOCUMENTS 1,745,175 A 1/1930 Lilienfeld
6,144,048 A 11/2000 Suemitsu et al.
(Continued)

FOREIGN PATENT DOCUMENTS

CN 107924917 A 4/2018
WO 2017/112657 A1 6/2017

OTHER PUBLICATIONS

Das et al., "A Review on Junctionless Transistor-A Prospective sub-10nm Logic Device," Advanced Research in Electrical and Electronic Engineering, vol. 1, No. 3 (2014) pp. 98-102.
(Continued)

*Primary Examiner* — Michael Jung
(74) *Attorney, Agent, or Firm* — Haynes Beffel & Wolfeld LLP

(57) ABSTRACT

Roughly described, an integrated circuit device includes a semiconductor having an overall length. In successively adjacent longitudinal sequence, the semiconductor includes first, second and third lengths all having a same first conductivity type. One end of the longitudinal sequence (the end adjacent to the first length) can be referred to a source end of the sequence, and the other end (adjacent to the third length) can be referred to as a drain end. Overlying the second length is a first gate conductor, which defines a first body region. Overlying a cascode portion of the third length is a second gate conductor, which defines a second body region. The second gate conductor preferably is longitudinally continuous with the first gate conductor, but if not, then the two are connected together by other conductors. The first body region is recessed relative to the first and third lengths of the semiconductor.

22 Claims, 10 Drawing Sheets

(51) Int. Cl.
*H01L 29/66* (2006.01)
*H01L 29/812* (2006.01)
*H01L 29/417* (2006.01)
*H01L 29/778* (2006.01)

(52) U.S. Cl.
CPC ........ *H01L 29/778* (2013.01); *H01L 29/7787* (2013.01); *H01L 29/785* (2013.01); *H01L 29/8128* (2013.01)

(56) References Cited

U.S. PATENT DOCUMENTS

| | | | |
|---|---|---|---|
| 7,190,050 B2 | 3/2007 | King et al. | |
| 8,587,031 B2 | 11/2013 | Lu et al. | |
| 9,455,329 B2 | 9/2016 | Min et al. | |
| 10,128,232 B2 | 11/2018 | Wong et al. | |
| 2002/0017648 A1* | 2/2002 | Kasahara | H01L 21/28575 257/79 |
| 2005/0051800 A1* | 3/2005 | Mishra | H01L 27/0605 257/202 |
| 2007/0018210 A1* | 1/2007 | Sheppard | H03F 3/217 257/289 |
| 2007/0194354 A1* | 8/2007 | Wu | H01L 29/402 257/288 |
| 2007/0228416 A1 | 10/2007 | Chen et al. | |
| 2008/0230784 A1 | 9/2008 | Murphy | |
| 2008/0283870 A1 | 11/2008 | Sato | |
| 2009/0032820 A1 | 2/2009 | Chen | |
| 2012/0175679 A1* | 7/2012 | Marino | H01L 29/402 257/194 |
| 2012/0235156 A1* | 9/2012 | Kuraguchi | H01L 29/42316 257/76 |
| 2013/0161641 A1 | 6/2013 | Kub et al. | |
| 2014/0239346 A1 | 8/2014 | Green et al. | |
| 2015/0162424 A1 | 6/2015 | Briere | |
| 2017/0133495 A1* | 5/2017 | Cho | H01L 21/02236 |
| 2017/0141208 A1* | 5/2017 | Iucolano | H01L 29/7787 |
| 2017/0186860 A1 | 6/2017 | Wong et al. | |
| 2018/0102477 A1 | 4/2018 | Choi et al. | |
| 2018/0374654 A1* | 12/2018 | Jia | H01L 51/4226 |

OTHER PUBLICATIONS

Dhara et al., "Facile fabrication of lateral nanowire wrap-gate devices with improved performance," Applied Physics Letters 99, No. 17 (2011): 173101, 3 pages.

Im et al., "First demonstration of heterojunction-free GaN nanochannel FinFETs." in Power Semiconductor Devices and ICs (ISPSD), 2013 25th International Symposium on, pp. 415-418. IEEE, 2013.

Im et al., "High-performance GaN-based nanochannel FinFETs with/without AlGaN/GaN heterostructure" IEEE Transactions on Electron Devices, 60, No. 10 (2013): 7 pages.

Mertens et al., "Gate-all-around MOSFETs based on vertically stacked horizontal Si nanowires in a replacement metal gate process on bulk Si substrates," in VLSI Technology, 2016 IEEE Symposium on, 2 pages.

Trevisoli et al., "A physically-based threshold voltage definition, extraction and analytical model for junctionless nanowire transistors," Solid-State Electronics 90 (2013): pp. 12-17.

Das et al., "Limitations on Lateral Nanowire Scaling Beyond 7-nm Node," IEEE Electron Device Letters 38, No. 1 (2017): pp. 9-11.

Veloso et al., "Gate-all-around nanowire FETs vs. triple-gate FinFETs: on gate integrity and device characteristics," ECS Transactions 72, No. 2 (2016): pp. 85-95.

Yeh et al., "High performance ultra-thin body (2.4 nm) poly-Si junctionless thin film transistors with a trench structure." in Electron Devices Meeting (IEDM), 2014 IEEE International, 4 pages.

Lu, B., "High-Performance Integrated Dual-Gate AlGaN/GaN Enhancement-Mode Transistor," IEEE Electron Device Letters, vol. 31, No. 9, Sep. 2010, pp. 990-992.

Moon, J.S., et al., >70% Power-Added-Efficiency Dual-Gate, Cascode GaN HEMTs Without Harmonic Tuning, IEEE Electron Device Letters, vol. 37, No. 3, Mar. 2016, pp. 272-276.

Besland, et al. "Interpretation of stress variation in silicon nitride films deposited by electron cyclotron resonance plasma." Journal of Vacuum Science & Technology A: Vacuum, Surfaces, and Films 22.5 (2004): 1962-1970.

Gupta et al., "7-nm FinFET CMOS design enabled by stress engineering using Si, Ge, and Sn," IEEE Transactions on Electron Devices 61, No. 5 , May 2014, pp. 1222-1230.

\* cited by examiner

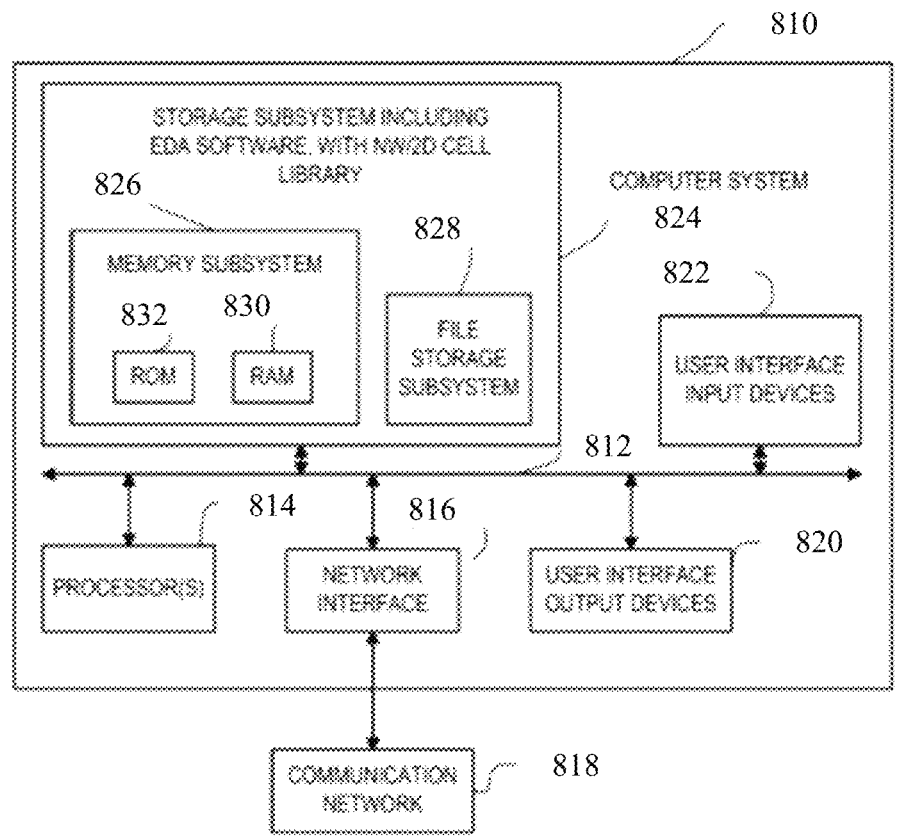
FIG. 8A
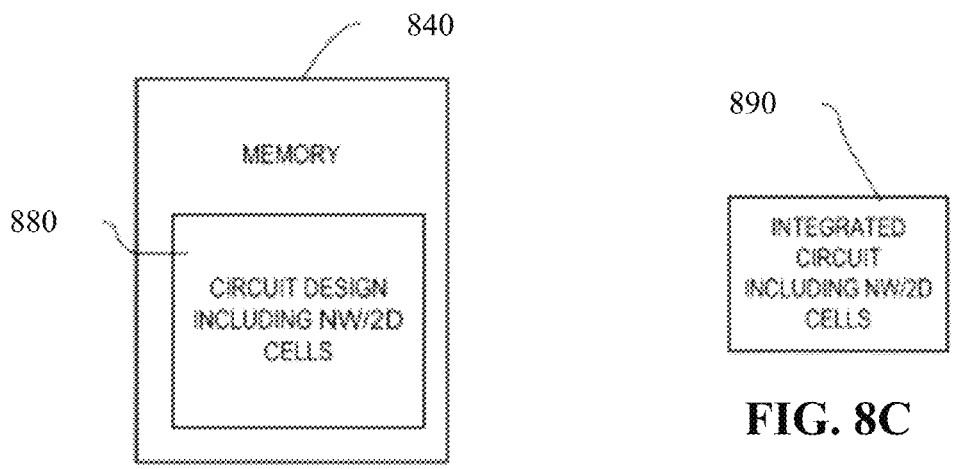
FIG. 8B
FIG. 8C

CONSTRICTED JUNCTIONLESS FINFET/NANOWIRE/NANOSHEET DEVICE HAVING CASCODE PORTION

CROSS REFERENCE TO OTHER APPLICATIONS

This application claims the benefit of U.S. Provisional Application No. 62/613,596, filed Jan. 4, 2018, entitled "CONSTRICTED JUNCTION-LESS FinFET/NANOWIRE/NANOSHEET WITH NORMALLY-OFF Vth, HIGH Ion AND LOW LEAKAGE," by Hiu Yung Wong, Nelson de Almeida Braga, Rimvydas Mickevicius, which is incorporated by reference herein in its entirety.

FIELD OF THE INVENTION

The invention relates to integrated circuit devices, and more particularly to a junctionless switching device having high on-current, low leakage current, and a threshold voltage which may be positive.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

BACKGROUND—DISCLAIMER

In the following Background, Summary, and Detailed Description, headings should not be construed as necessarily limiting. In the following Background, Summary and Detailed Description, citation or identification of any publication does not signify relevance or status as prior art for any of the claimed or described embodiments.

BACKGROUND

Junctionless devices, which can be nano-wire, FinFET or Nanosheet or even planar devices such as SOI (silicon on insulator), are promising candidates for the sub-7 nm technology nodes. This is because they obviate the need for specially controlled channel doping, which makes the manufacturing process simpler. The operating mechanism is based on depleting a heavily doped channel in the OFF state (e.g. by applying a negative Vgs for an N-type device) and recovering the heavily doped channel in the ON state (e.g. by applying a positive Vgs for an N-type device). As junctionless devices operate using bulk conduction, rather than conduction within a channel region formed adjacent to the channel semiconductor surface, the mobility of a junctionless device is less dependent on the surface quality. It is also less susceptible to negative-bias temperature instability (NBTI) due to low surface electric field in ON state.

However, because of its operating mechanism, junctionless devices require a thick cross-section and heavy doping in order to drive large currents. But a thick cross-section makes it more difficult to turn the device off, resulting in a negative threshold voltage for N-type devices (or a positive threshold voltage for P-type devices). Such threshold voltages are not desirable in CMOS applications. The dilemma of junctionless devices can be thought of as being similar to a hose that when the cross section is large, it can conduct more water but is also more difficult to turn off by squeezing the hose.

SUMMARY

The claims signify a brief description of one or more of the innovations, embodiments, and/or examples found within this disclosure.

This Summary does not attempt to completely signify any particular innovation, embodiment, or example as it can be used in commerce. Additionally, this Summary is not intended to signify essential elements of an innovation, embodiment or example or to limit the scope of the subject matter of this disclosure.

The innovations, embodiments, and/or examples found within this disclosure are not all-inclusive, but rather describe the basic significance of the subject matter. Accordingly, one use of this Summary is as a prelude to a Detailed Description presented later.

Roughly described, an integrated circuit device includes a semiconductor having an overall length. In successively adjacent longitudinal sequence, the semiconductor includes first, second and third lengths all having a same first conductivity type, for example N-type. One end of the longitudinal sequence (the end adjacent to the first length) can be referred to a source end of the sequence, and the other end (adjacent to the third length) can be referred to as a drain end. Overlying the second length is a first gate conductor, which defines a first body region. Overlying a cascode portion of the third length is a second gate conductor, which defines a second body region. The second gate conductor preferably is longitudinally continuous with the first gate conductor, but if not, then the two are connected together by other conductors. The first body region is recessed relative to the first and third lengths of the semiconductor.

The recessed first body region can be designed to have a positive threshold voltage (for N-type semiconductor), whereas the unrecessed second body region has a negative threshold (for N-type semiconductor). But due to a cascode effect, the combined structure acts as a long gate length positive (for N-type semiconductor) threshold voltage transistor during OFF state. For P-type semiconductor, the recessed first body region can be designed to have a negative threshold voltage, whereas the unrecessed second body region has a positive threshold. And due to the cascode effect, the combined structure acts as a long gate length negative threshold voltage transistor during OFF state. So for either conductivity type, the structure behaves much like short channel device during ON state but a long channel device during OFF state. As a result, it has much lower drain-induced barrier lowering (DIBL) (short channel effect) but still has strong ON current and high breakdown voltage.

TCAD simulations are used to verify the concepts. Note only nanowire is simulated but the concept can be applied equally to FinFET or Nanosheet or even planar devices such as SOI.

One or more embodiments of the invention or elements thereof can be implemented in the form of a computer product including a non-transitory computer readable storage medium with computer usable program code for performing the method steps indicated. Furthermore, one or more embodiments of the invention or elements thereof can be implemented in the form of an apparatus including a memory and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) executing on one or more hardware processors, or (iii) a combination of hardware and software modules; any of (i)-(iii) implement the specific techniques set forth herein, and the software modules are stored in a computer readable storage medium (or multiple such media).

These and other features, aspects, and advantages of the invention will become apparent from the following detailed description of illustrative embodiments thereof, which is to be read in connection with the accompanying drawings.

BRIEF DESCRIPTION OF THE DRAWINGS

The following Detailed Description, Figures, and Claims signify the nature and advantages of the innovations, embodiments and/or examples of the claimed inventions. All of the Figures signify innovations, embodiments, and/or examples of the claimed inventions for purposes of illustration only and do not limit the scope of the claimed inventions. Such Figures are not necessarily drawn to scale, and are part of the Disclosure.

In the Figures, similar components or features may have the same, or similar, reference signs in the form of labels (such as alphanumeric symbols, e.g., reference numerals), and may signify similar or equivalent functionality. Further, various components of the same type may be distinguished by following the reference label by a dash and a second label that distinguishes among the similar components. If only the first reference label is used in the specification, the description is applicable to any one of the similar components having the same first reference label irrespective of the second reference label. A brief description of the Figures is below.

FIGS. 8A, 8B and 8C (collectively FIG. 8) are simplified block diagrams of a computer system suitable for use with embodiments of the technology, as well as circuit design and circuit embodiments of the technology.

In such various figures, reference signs may be omitted as is consistent with accepted engineering practice; however, one of ordinary skill in the art will understand that the illustrated components are readily understood when viewed in context of the illustration as a whole and the accompanying disclosure describing such various figures.

DETAILED DESCRIPTION

The Figures and the following Detailed Description signify innovations, embodiments and/or examples by way of illustration only, with various features, structures or characteristics described together in a single embodiment to streamline the disclosure. Variations of any of the elements, processes, machines, systems, manufactures or compositions disclosed by such exemplary innovations, embodiments and/or examples will be readily recognized and may be used in commerce without departing from the principles of what is claimed. The Figures and Detailed Description may also signify, implicitly or explicitly, advantages and improvements of a subset of the exemplary embodiments described herein.

In the Figures and Detailed Description, numerous specific details may be described to provide a thorough understanding of one or more of the exemplary innovations, embodiments and/or examples. In the interest of not obscuring the presentation of the exemplary innovations, embodiments and/or examples in the following Detailed Description, some processing steps or operations that are known in the art may have been combined together for presentation and for illustration purposes and might not be described in detail. However, a person skilled in the art will recognize that these exemplary innovations, embodiments and/or examples may be used in commerce without these specific details or with equivalents thereof. In other instances, well-known processes and devices are not described in detail as not to unnecessarily obscure aspects of these exemplary innovations, embodiments and/or examples. In other instances, some processing steps or operations that are known in the art may not be described at all. The following description is instead focused on the distinctive features or elements of various exemplary innovations, embodiments and/or examples. Furthermore, while this description may refer to some components of the structure in the singular tense, more than one component may be depicted throughout the Figures and like components are labeled with like numerals.

Example 1: Recess of the Whole Region Under the Gate

Figure 1A:
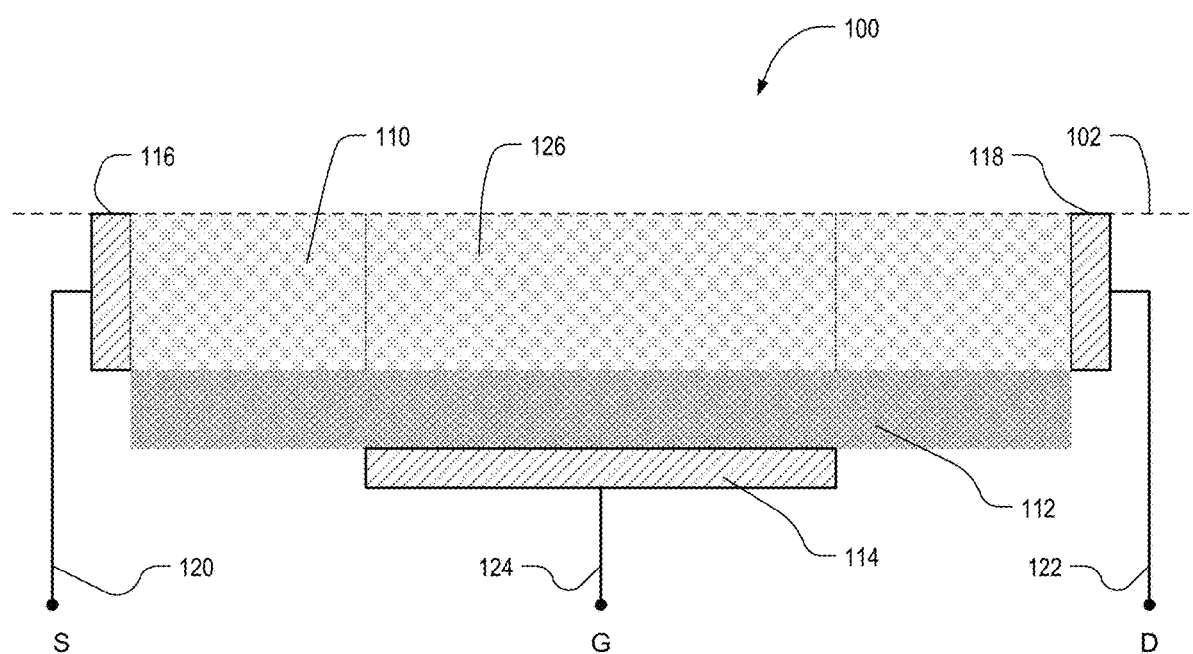
FIG. 1A illustrates a cross section of a conventional junctionless nanowire transistor (only half the device is shown).

FIG. 1A shows the cross section of a junctionless horizontal nanowire transistor 100 (full nanowire transistor is obtained by rotating about the horizontal broken line 102). The device has a semiconductor 110 having source and drain contacts 116 and 118 on longitudinally opposite source and drain ends, respectively. The semiconductor 110 may be, for example, silicon, germanium, III-V or other materials that can be used as a nanowire. The entire length of the semiconductor 110 has the same conductivity type, which may be N or P. A gate stack is formed midway along the length of the semiconductor 110 longitudinally. the gate stack includes a gate dielectric layer 112 adjacent to the surface of the semiconductor 110, and a gate conductor 114 overlying the gate dielectric layer 112. The gate dielectric is an insulator and may be, for example, an oxide or nitride. In the example of FIG. 1A, doping level is constant along the entire length of semiconductor 110, and is 1e20 cm-3. The diameter of the semiconductor 110 is 6 nm and the gate length is 5 nm. It is noted that the gate dielectric layer may extend beyond the gate conductor longitudinally, but the body of the transistor, identified in the drawing as 126, is defined by the region underlying the gate conductor. The longitudinal extent of the body region 126 is indicated in the drawing with dotted lines, it being understood that no physical interface actually exists in the physical semiconductor at the position of such dotted lines. Source, drain and gate terminals 120, 122, and 124 are connected to the source, drain and gate conductors 116, 118, and 114 respectively, and such terminals are connected by other conductors not shown to other circuitry in the device.

As used herein, a particular layer described as "overlying" or "underlying" a subject surface does not necessarily mean that the particular layer must be located vertically above or below (respectively) the subject surface. As used herein, a particular layer "overlies" a subject surface if it is perpendicularly farther away from the underlying bulk than is the subject surface, and the particular surface "underlies" the subject surface if it is perpendicularly nearer to the underlying bulk than is the subject surface. For a lateral nanowire structure, for example, a gate layer that is said to "overlie" a body region of a semiconductor includes portions that are above, below and on all sides of the semiconductor, as the terms are used herein. Also, as used herein, when a particular layer is said to "overlie" or "underlie" a subject surface, it is not required that the particular layer be immediately adjacent to the subject surface. For example, in a gate stack, the gate conductor can be said to overlie the semiconductor body, even though it is separated from the semiconductor body by a gate dielectric.

In operation, if the gate conductor were left floating, the semiconductor 110 would act as a resistor series-connected between the source and drain contacts 116 and 118. As a voltage is applied across the gate and source terminals (Vgs), carriers are depleted from the semiconductor in the body region, beginning to choke off the current flow. At some level of Vgs, the transistor crosses the threshold voltage of the device and reaches its off-state. However, as described above, doping of the semiconductor must be heavy and the cross-section orthogonal to the current flow direction needs to be thick in order to drive large currents. But that necessity conflicts with the reality that a thick cross-section makes it more difficult to turn the device off, because the electric field generated by the gate voltage may not penetrate with sufficient strength into the interior of the semiconductor. This results undesirably in a negative threshold voltage for N-type devices, or a positive threshold voltage for P-type devices.

As used herein, the "on-state" of a junctionless transistor is defined as the state of the transistor when Vgs>Vth for N-type semiconductor (or when Vgs<Vth for P-Type semiconductor), and as used herein, the "off-state" of a junctionless transistor is defined as the state of the transistor when Vgs<Vth for N-type semiconductor (or when Vgs>Vth for P-Type semiconductor). The threshold voltage Vth of a junctionless transistor device, as used herein, is defined as the point of equal magnitude for the drift and diffusion components of the drain current. See Trevisoli, "A physically-based threshold voltage definition, extraction and analytical model for junctionless nanowire transistors," Solid-State Electronics 90 (2013) at 12-17, incorporated by reference herein, which also sets forth methods for extracting such threshold voltage from a device.

Figure 1B:
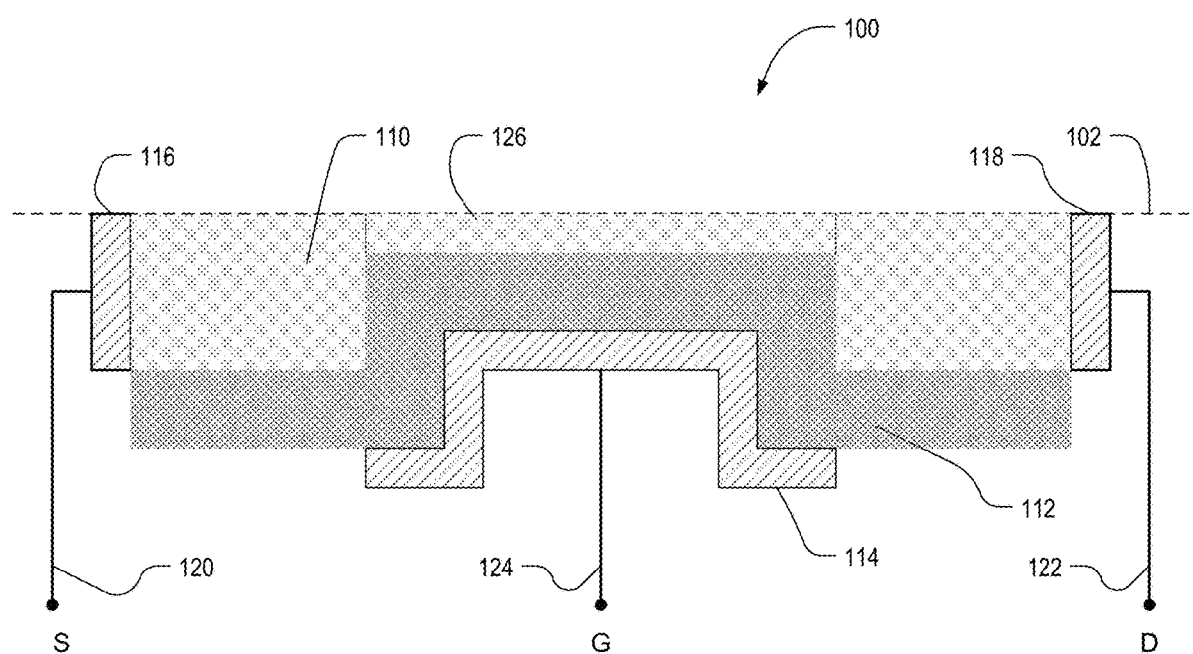
FIG. 1B illustrates a modification of the structure of FIG. 1A to include a recessed region.

FIG. 1B illustrates one technique for mitigating the trade-off, involving recessing the region under the gate. In the example of FIG. 1B the body region has been recessed such that it is only 2 nm thick. Because of the recess, the structure of FIG. 1B has better gate control over the body region.

Figure 2:
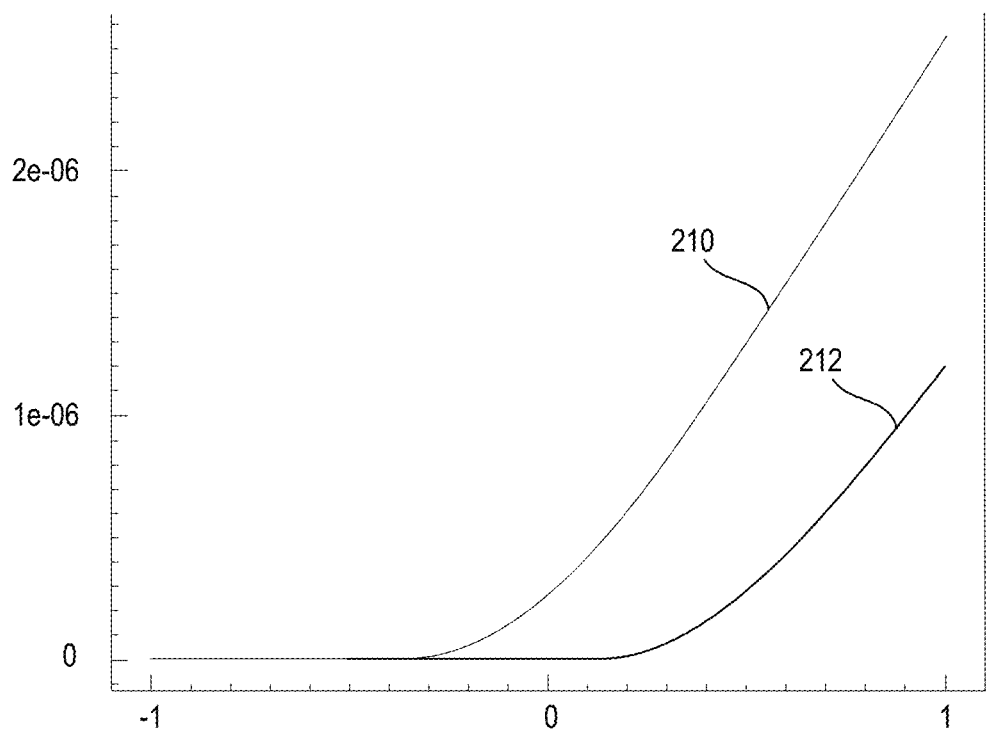
FIGS. 2 and 3 are plots of the drain current as a function of the gate voltage, for both the structures of FIG. 1A and FIG. 1B.
Figure 3:
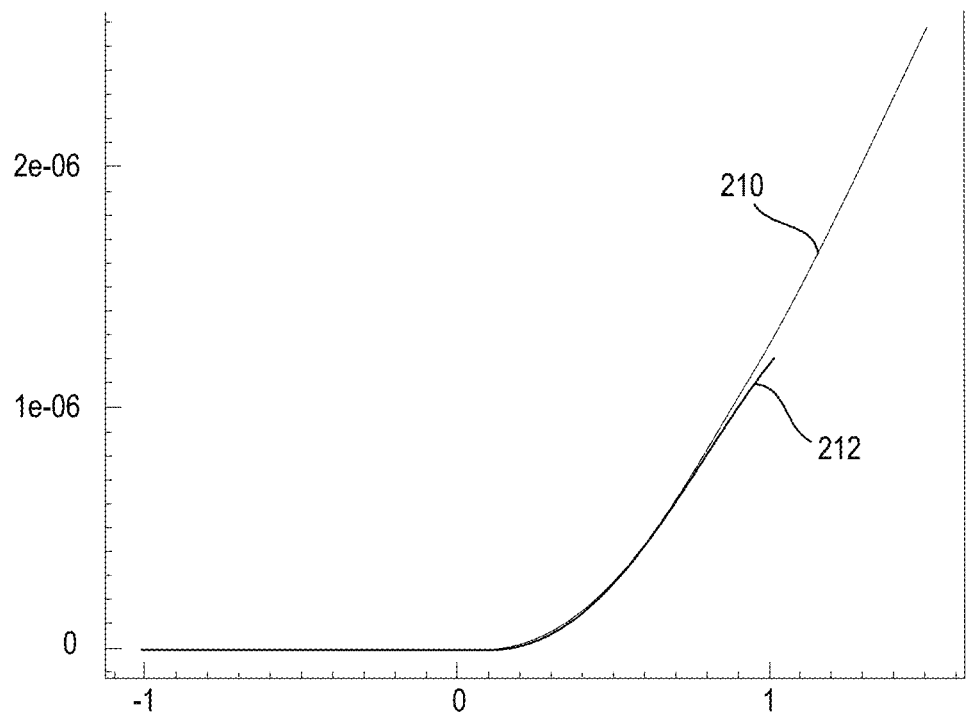

FIG. 2 compares the drain current Id as a function of Vgs for the devices of FIGS. 1A and 1B. Curve 210 illustrates the drain current for the device of FIG. 1A, and it can be seen that the threshold voltage is negative. Curve 212 illustrates the drain current for the device of FIG. 1B, and it can be seen that the threshold voltage is more positive. FIG. 3 illustrates the same two curves with the curve 212 shifted so that the two curves have the same OFF current Ioff. It can be seen that the ON current Ion is slightly degraded when the FIG. 1B device is turned on relative to that of the FIG. 1A device, but not significantly.

Example 2: Recess of a Part of Region Under the Gate to Form Cascode Configuration While Example 1 can make device Vth>0, a cascode structure can be used to further reduce the off state current and increase sub-threshold slope. A cascode structure is a two-stage amplifier (typically transistors) that consists of a common-source stage amplifier with a Vin input signal applied to its gate, its drain feeding into a common-gate amplifier stage with its drain providing a Vout output signal. In a typical traditional use of a cascode arrangement, the gate of the common-gate stage is connected to constant voltage. In the embodiments herein, however, the gates of the common-source and common-gate transistors are connected together. See FIG. 5 and accompanying discussion below.

Figure 4:
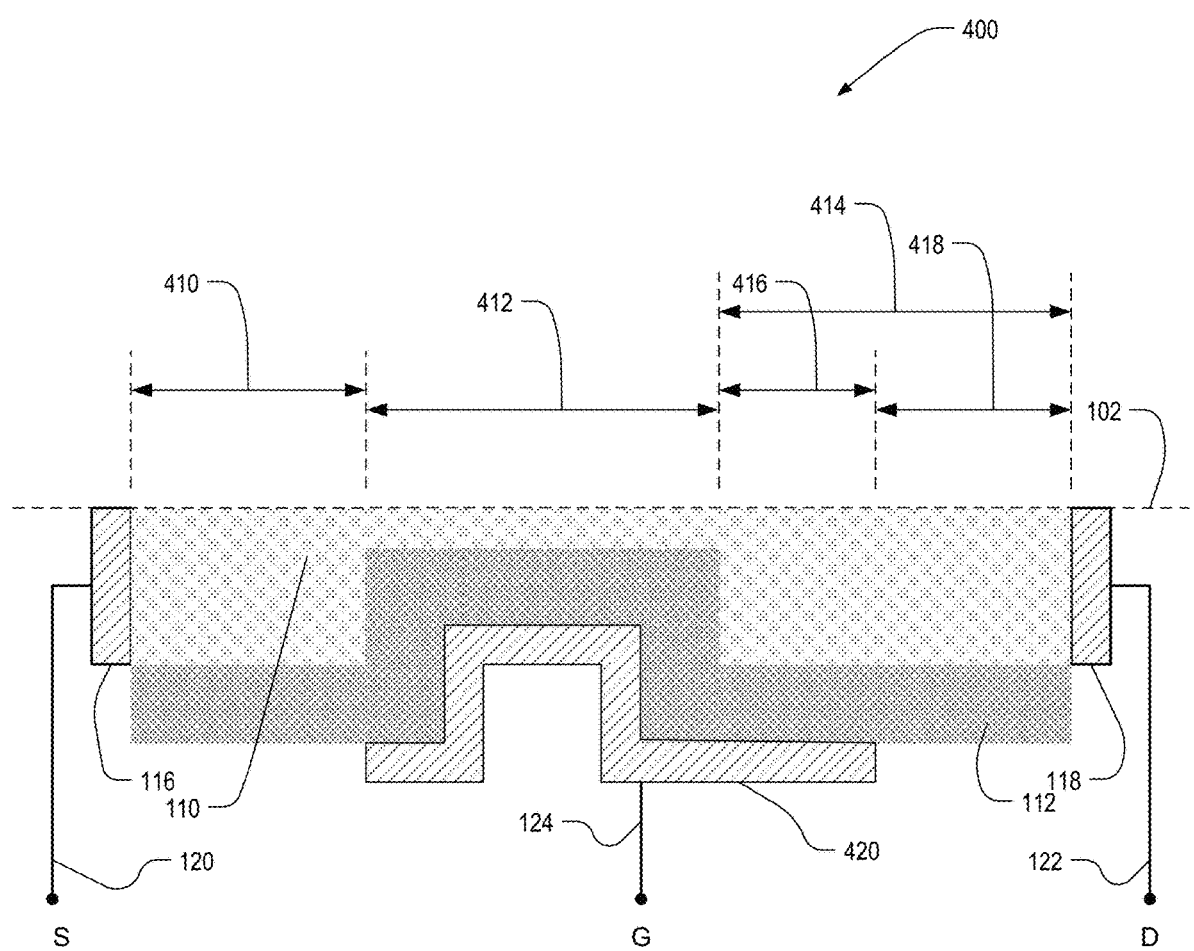
FIG. 4 illustrates a cross section of a junctionless nanowire transistor according to aspects of the invention (only half the device is shown).

FIG. 4 shows a structure 400 incorporating aspects of the invention. Like FIGS. 1A and 1B, FIG. 4 shows a cross section of a junctionless horizontal nanowire transistor 100 (full nanowire transistor is obtained by rotating about the horizontal broken line 102). The device has a semiconductor 110 having source and drain contacts 116 and 118 on longitudinally opposite ends. Source, drain and gate terminals 120, 122, and 124 are connected to the source, drain and gate conductors 116, 118, and 114 respectively, and such terminals are connected by other conductors not shown to other circuitry in the device. The semiconductor 110 may be, for example, silicon, germanium, III-V or other materials that can be used as a nanowire. The entire length of the semiconductor 110 has the same conductivity type, which may be N or P. The doping level is constant along the entire length of semiconductor 110, and in this example is 1e20 cm-3. In different embodiments, the doping level can vary along the length of semiconductor 110, though the doping type remains constant.

The structure of FIG. 4 can be thought of as having, in successively adjacent longitudinal sequence, first, second and third lengths 410, 412 and 414. Length 414 is further divided into lengths 416 and 418. Length 410 can be thought of as the source region of the device, and the source region of the primary transistor whose body region, in length 412, is recessed as shown and discussed with respect to FIG. 1B. The first portion 416 of length 414 is the body region of an unrecessed transistor as shown and discussed with respect to FIG. 1A. The remaining portion 418 of length 414 can be thought of as the drain region of the device.

A gate stack is formed on the device, having a gate dielectric 112 as described with respect to FIG. 1A and a gate conductor 420. The gate conductor 420 overlies both the second length 412 of the semiconductor 110, and also the portion 416 of length 414 of the semiconductor 110. In FIG. 4 the gate conductor 420 is a longitudinally continuous conductive layer, but in another embodiment the portion of the conductor overlying the recessed transistor and the portion overlying the unrecessed transistor could be spaced from each other longitudinally. In the latter case the body of the unrecessed transistor, identified by length 416 in FIG. 4, may be located somewhere in the middle of length 414, spaced longitudinally from both the body of the recessed transistor and the drain contact 118. Each of the two transistors has its own gate conductor in this latter case, but they still are connected together electrically at higher layers of the integrated circuit device.

As in FIGS. 1A and 1B, the gate dielectric is an insulator and may be, for example, an oxide or nitride. The diameter of the semiconductor along the recessed length 412 is within a range of 1 nm to 10 nm, and in the example of FIG. 4, the diameter is 2 nm. The diameter of the semiconductor 110 along the remainder of the length is from 1 nm to 30 nm, but preferably at least 1 nm larger than that along recessed length 412. In the example of FIG. 4 the diameter along the remainder of the length is 6 nm. The length of the recessed region 412 is 5 nm, as is the length 416 of the body of the unrecessed transistor. No gate conductor overlies any part of the source region (length 410) of the semiconductor 110, the gate conductor terminating at the adjacent edge of the body region of the recessed transistor. Other aspects of the structure of FIG. 4 are the same as for FIG. 1A.

Figure 5:
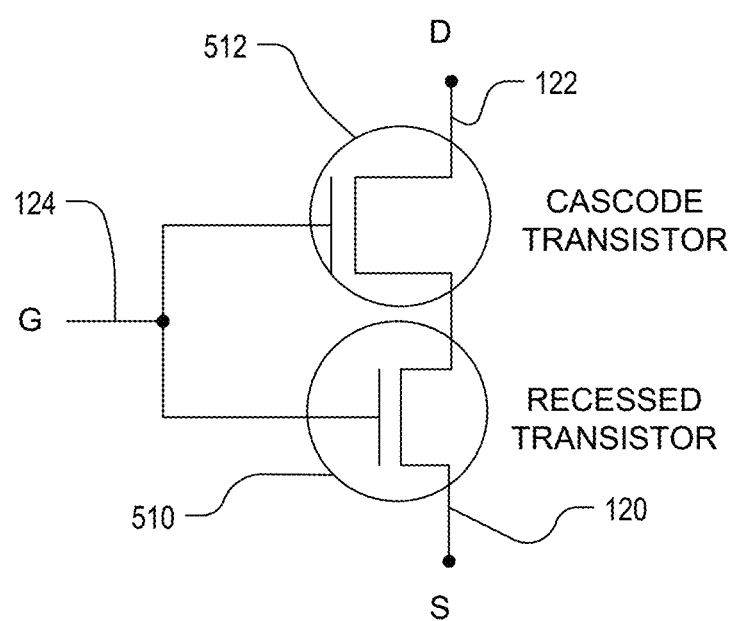
FIG. 5 illustrates a circuit schematic of two transistors in cascode configuration.

The cascode structure of FIG. 4 can be treated as a series of two transistors. A circuit symbol is shown in FIG. 5. As can be seen, the structure can be thought of as a recessed transistor 510 in series connection with a cascode transistor 512. The source region (length 410 in FIG. 4) is connected as the source of the overall structure, and the drain region (length 418 in FIG. 4) is connected as the drain of the overall structure. The gates are connected together as gate terminal 124. The recessed transistor 510 has a positive threshold voltage, whereas the cascode transistor 512 has a negative threshold voltage. However, due to the cascode effect, the combined structure acts as a long gate length positive threshold voltage transistor during OFF state. So the structure behaves as short channel device during ON state but a long channel device during OFF state. As a result, it has much lower drain-induced barrier lowering (DIBL) (short channel effect) but still has similar ON current as in the recessed device of FIG. 1B.

Figure 6:
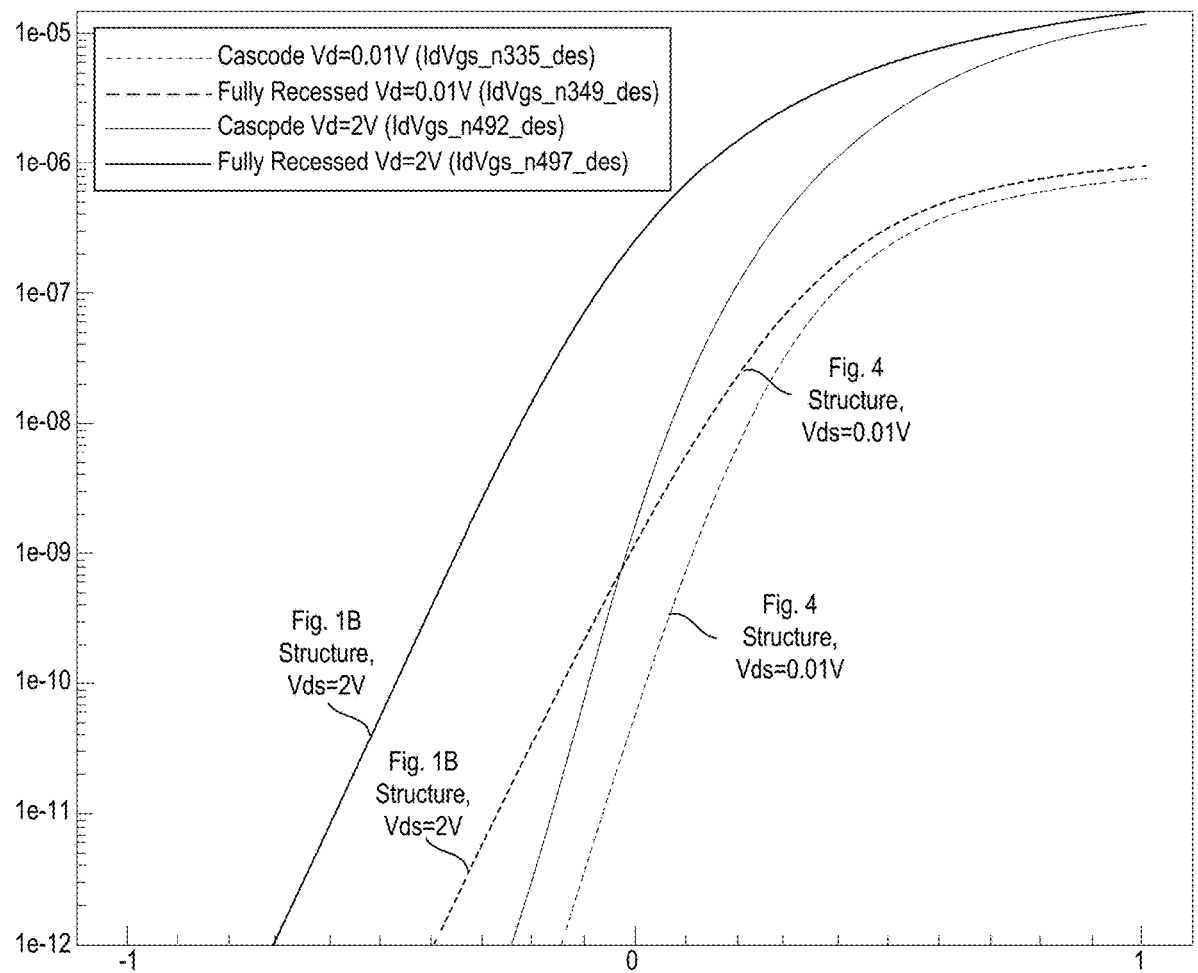
FIGS. 6 and 7 are plots of the drain current as a function of the gate voltage, for both the structures of FIG. 1B and FIG. 4.
Figure 7:
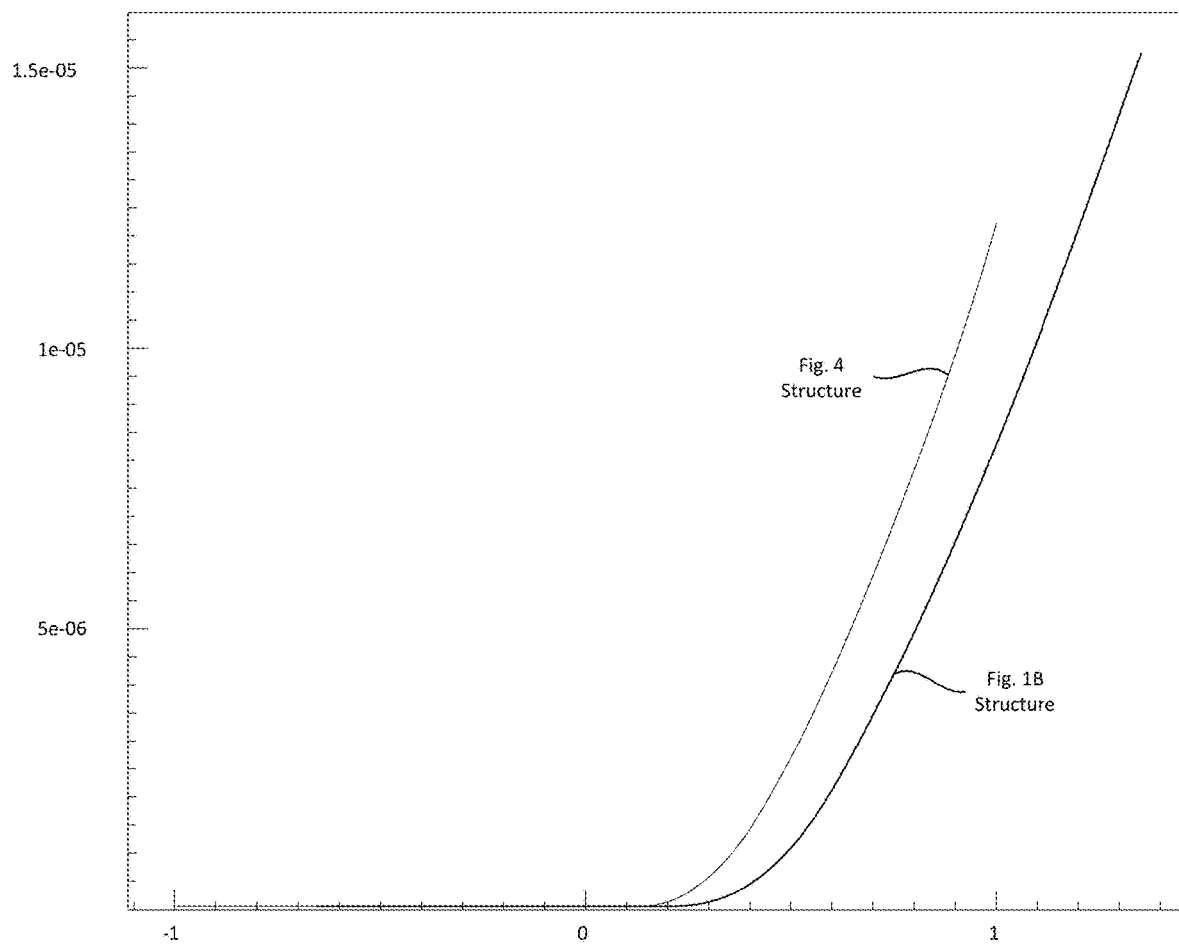

FIG. 6 compares the drain current Id as a function of Vgs for the FIG. 1B structure (recessed transistor alone) and the FIG. 5 structure (cascode structure), for both Vds=0.01V and Vds=2V, on a logarithmic scale. FIG. 7 compares the drain current Id as a function of Vgs for the FIG. 1B structure and the FIG. 5 structure, for Vds=2V on a linear scale. In FIG. 7, the curve for the FIG. 1B structure has been shifted so as to have the same Ioff as for the Cascode structure of FIG. 5. It can be seen that the cascode structure delivers a 50% gain in ION (at Vgs=1V) as compared to the recessed transistor alone structure of FIG. 1B.

The cascode structure is especially useful for III-V materials (which typically exhibit low tunneling mass) or Ge (which has a small band gap) in which Source-to-Drain tunneling is severe.

The length of recessed length 412 should be between 1 nm and 10 nm, and in the example of FIG. 4 it is 5 nm. The length of the length 416 should be between 1 nm and 20 nm, and in FIG. 4 it is 5 nm. The source region (in length 410) should be relatively short, since any increase in its length tends to reduce Ion. The same is true of the drain region (the length 418 in FIG. 4), for the same reason. The length 412 of the recessed region is preferably relatively short, because the narrow cross-section of the recessed region introduces increased resistance along its length. Thus the longer the recessed region, the more additional resistance it introduces. The length 416 can be made short or long, as required for a particular application given the following considerations: a longer region 416 increases the breakdown voltage, but reduces both Ion and Ioff.

Method of Making Cascode Structure

Cascode structures can be made in nanowires as shown in FIG. 4, in which case the gate conductor preferably wraps all the way around the nanowire. It can also be made in a fin structure, in which the gate conductor wraps around two or three non-coplanar surfaces of the structure. It can also be made in a planar SOI structure, in which the semiconductor 110 is formed in a layer overlying an insulating layer (not shown), which itself overlies a substrate (not shown). Nanowire embodiments can be in either lateral nanowires or vertical nanowires.

This section describes a method for making a cascode structure in an SOI structure, a fin structure, or a horizontal nanowire. Initially, the semiconductor is formed by a conventional method. A horizontal nanowire, for example, may be supported on opposite ends by pedestals. The semiconductor is doped uniformly as in the example of FIG. 4. A mask is defined for the recess, where the mask covers the region outside of the recess region. An isotropic etch is applied to the unmasked region to create the recess. The inside corners of the recess are more rounded than as illustrated symbolically in FIG. 4. The gate dielectric is then applied over the semiconductor, and the gate conductor is applied over the gate dielectric. The gate conductor is patterned by known techniques (e.g. photolithography and etching) to remove gate material that is outside the lengths 412 and 416 of FIG. 4.

Method of Making Cascode Structure for Vertical Nanowire

To make a cascode device in a vertical nanowire, assuming the source is at the bottom of the nanowire, the source contact is formed as a conductive layer below the nanowires. The nanowires are then formed using layers deposited with different materials. For example, three layers consisting of Si (5 nm)/$Si_xGe_{1-x}$ (5 nm)/Si (10 nm). The layers are patterned by known methods to form uniformly doped and uniform diameter vertical nanowires. Then timed selective etch is used to recess the SiGe layer in the nanowires. Oxidation can be used, which has a different rate on different materials, and the oxide can then be removed afterwards to achieve the same purpose. A first interlayer dielectric layer is formed over the source conductor layer, to a 5 nm thickness matching the height of the source region of the nanowire. The recess remains exposed. Gate dielectric material is then formed by coating the remaining exposed nanowire with an appropriate dielectric material. The gate conductor is then formed on the first interlayer dielectric, to a thickness of 10 nm (the 5 nm length of the recess plus the first 5 nm of the unrecessed body portion. The gate conductor layer is then patterned for desired circuit interconnects. A second interlayer dielectric is formed over the gate conductor layer, to a 5 nm thickness matching the height of the drain region of the nanowire. The top end of the nanowire remains exposed. The drain contact is then formed as a conductive layer on top of the nanowires, and patterned for desired circuit interconnects.

As used herein, no distinction is intended between substances of an integrated circuit which are disposed in the substrate body itself, or disposed in an overlying layer. All of the features of an integrated circuit device are all described equivalently herein as being either "on" the substrate or "in" the substrate or other carrier, and no distinction is intended between the two words.

Technology Support General Computer Explanation

FIGS. 8A, 8B and 8C are simplified block diagrams of a computer system suitable for use with embodiments of the technology, as well as circuit design and circuit embodiments of the technology.

Computer system 810 typically includes at least one computer or processor 814 which communicates with a number of peripheral devices via bus subsystem 812. Typically, the computer can include, or the processor can be, any of a microprocessor, graphics processing unit, or digital signal processor, and their electronic processing equivalents, such as an Application Specific Integrated Circuit (ASIC) or Field Programmable Gate Array (FPGA). The terms 'processor' and 'computer' are further defined below. These peripheral devices may include a storage subsystem 824, comprising a memory subsystem 826 and a file storage subsystem 828, user interface input devices 822, user interface output devices 820, and a network interface subsystem 816. The input and output devices allow user interaction with computer system 810.

The computer system may be a server computer, a client computer, a workstation, a mainframe, a personal computer (PC), a tablet PC, a set-top box (STB), a personal digital assistant (PDA), a cellular telephone, a smartphone, a web appliance, a kiosk, a television, a game station, a network router, switch or bridge, or any data processing machine capable of executing instructions 124 (sequential or otherwise) that specify actions to be taken by that machine. The computer system typically includes an operating system, such as Microsoft's Windows, Apple Computer's Mac OS, Linux or Unix.

Innovations, embodiments and/or examples of the claimed inventions are neither limited to conventional computer applications nor the programmable apparatus that run them. For example, the innovations, embodiments and/or examples of the claimed inventions can include an optical computer, quantum computer, analog computer, or the like. The computer system may be a multi-processor or multi-core system and may use or be implemented in a distributed or remote system. The term 'processor' here is used in the broadest sense to include a singular processor and multi-core or multi-processor arrays, including graphic processing units, digital signal processors, digital processors and combinations of these devices. Further, while only a single computer system or a single machine may be illustrated, the use of a singular form of such terms shall also signify any collection of computer systems or machines that individually or jointly execute instructions 124 to perform any one or more of the sets of instructions discussed herein. Due to the ever-changing nature of computers and networks, the description of computer system 810 depicted in FIG. 8A is intended only as one example for purposes of illustrating the preferred embodiments. Many other configurations of computer system 810 are possible having more or less components than the computer system depicted in FIG. 8A.

Network interface subsystem 816 provides an interface to outside networks, including an interface to communication network 818, and is coupled via communication network 818 to corresponding interface devices in other computer systems or machines. Communication network 818 may comprise many interconnected computer systems, machines and communication links. These communication links may be wireline links, optical links, wireless links, or any other devices for communication of information. Communication network 818 can be any suitable computer network, for example a wide area network such as the Internet, and/or a local area network such as Ethernet. The communication network can be wired and/or wireless, and the communication network can use encryption and decryption methods, such as is available with a virtual private network.

User interface input devices 822 may include an alphanumeric keyboard, pointing devices such as a mouse, trackball, touchpad, stylus, or graphics tablet, a scanner, a touchscreen incorporated into the display, audio input devices such as voice recognition systems, microphones, and other types of input devices. In general, use of the term "input device" is intended to include all possible types of devices and ways to input information into computer system 810 or onto communication network 818.

User interface output devices 820 may include a display subsystem, a printer, a fax machine, or non-visual displays such as audio output devices. The display subsystem may include a cathode ray tube (CRT), a flat-panel device such as a liquid crystal display (LCD), a projection device, or some other device for creating a visible image such as a virtual reality system. The display subsystem may also provide non-visual display such as via audio output or tactile output (e.g., vibrations) devices. In general, use of the term "output device" is intended to include all possible types of devices and ways to output information from computer system 810 to the user or to another machine or computer system.

Memory subsystem 826 typically includes a number of memories including a main random-access memory (RAM) 830 (or other volatile storage device) for storage of instructions and data during program execution and a read only memory (ROM) 832 in which fixed instructions are stored. File storage subsystem 828 provides persistent storage for program and data files, and may include a hard disk drive, a floppy disk drive along with associated removable media, a CD-ROM drive, an optical drive, a flash memory, or removable media cartridges. The databases and modules implementing the functionality of certain embodiments may be stored by file storage subsystem 828.

Bus subsystem 812 provides a device for letting the various components and subsystems of computer system 810 communicate with each other as intended. Although bus subsystem 812 is shown schematically as a single bus, alternative embodiments of the bus subsystem may use multiple busses. For example, RAM-based main memory can communicate directly with file storage systems using Direct Memory Access (DMA) systems.

FIG. 8B shows a memory 840 such as a non-transitory, computer readable data and information storage medium associated with file storage subsystem 828, and/or with network interface subsystem 816, and can include a data structure specifying a circuit design. The memory 840 can be a hard disk, a floppy disk, a CD-ROM, an optical medium, removable media cartridge, or other medium that stores computer readable data in a volatile or non-volatile form. Software read into a computer from such a memory can be converted at a selected instance in time from a tangible form to a transmission signal that is propagated through a medium (such as a network, connector, wire, or trace as an electrical pulse or a medium such as space or an atmosphere as electromagnetic radiation with wavelengths in the electromagnetic spectrum longer than infrared light).

FIG. 8C is a block representing an integrated circuit 890 created with the described technology that includes one or more cells selected, for example, from a cell library.

Technology Support EDA System/Workflow Explanation

Figure 9:
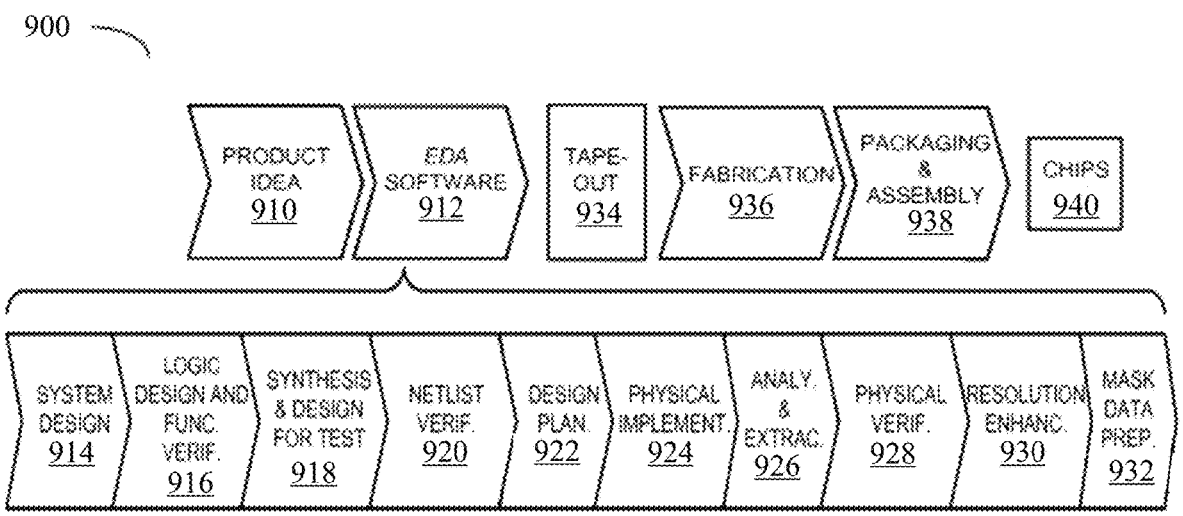
FIG. 9 illustrates various processes performed in the design, verification and fabrication of an item of manufacture such as an integrated circuit using software tools with a computer, and possibly special hardware-assisted tools, to transform and verify design data and instructions that represent the integrated circuit.

FIG. 9 illustrates various processes performed in the design, verification and fabrication of an item of manufacture such as an integrated circuit using software tools with a computer, and possibly special hardware-assisted tools, to transform and verify design data and instructions that represent the integrated circuit. These processes start with the generation of a product idea (910) with information supplied by a designer, information which is transformed during a process to create an item of manufacture (referred to herein as a design or device) that uses EDA software tools (912), which may also be signified herein as EDA software, as a design tool or a verification tool. When the design is finalized, it can be taped-out (934), which typically is when artwork for the integrated circuit is sent to a fabrication facility. After tape-out, a semiconductor die is fabricated (936) and packaging and assembly processes (938) are performed, which result in the finished integrated circuit (940) which may also be signified herein as a circuit, device, component, chip or SoC (System on Chip).

Items of manufacture, for example, a circuit or system are used in commerce at a variety of levels of abstraction ranging from low-level transistor layouts to high-level description languages. Most designers start at high-level of abstraction to design their circuits and systems, using a hardware description language (HDL) such as VHDL, Verilog, SystemVerilog, SystemC, MyHDL or OpenVera. The high-level HDL is easier for developers to comprehend, especially for a vast system, and may describe highly complex concepts that are difficult to grasp using a lower level of abstraction. The HDL description may be converted into other levels of abstraction as is helpful to the developers. For example, a high-level description may be converted to a logic-level register transfer level (RTL) description, a gate-level (GL) description, a layout-level description, or a mask-level description. Each lower abstraction level introduces more detail into the design description. The lower-levels of abstraction may be generated automatically by computer, derived from a design library, or created by another design automation technique. An example of a specification language at a lower level of abstraction is SPICE, much used detailed descriptions of analog-based circuits.

A design process that uses EDA software tools (912) includes tasks 914-932, which are described below. This design flow description is for illustration purposes only and is not meant to limit the present disclosure. For example, an actual integrated circuit design may require a designer to perform the design operations in a different sequence than the sequence described herein.

During system design (914), a designer describes the functionality to be manufactured. The designer can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect, Saber, System Studio, and DesignWare products.

During logic design and functional verification (916), modules in the circuit are specified in one or more hardware description languages, or HDLs, and the design in HDL is checked for functional accuracy. More specifically, the design is checked to ensure that it produces the correct outputs. Exemplary HDL languages are Verilog, VHDL and SystemC. Functional verification is typically done by using software-based simulators and other tools such as testbench generators, static HDL checking tools and formal verification tools. In some situations, special hardware referred to as 'emulators' or 'prototyping systems' are used to speed up the functional verification. Exemplary EDA software products from Synopsys, Inc. of Mountain View, Calif. that can be used at this stage include: VCS, Vera, DesignWare, Magellan, Formality, ESP and Leda products. Exemplary emulator and prototyping products also available from Synopsys that can be used at this state include: Zebu® and Protolink®.

During synthesis and design for test (918), VHDL/Verilog code is translated to a netlist. This netlist can be optimized for the target technology. Additionally, tests can be designed and implemented to check the finished integrated circuit. Exemplary EDA software products from Synopsys, Inc. of Mountain View, Calif. that can be used at this stage include: Design Compiler, Physical Compiler, Test Compiler, Power Compiler, FPGA Compiler, Tetramax, and DesignWare products.

During netlist verification (920), the netlist is checked for compliance with timing constraints and for correspondence with the VHDL/Verilog code. Exemplary EDA software products from Synopsys, Inc. of Mountain View, Calif. that can be used at this stage include: Formality, Primetime, and VCS products.

During design planning (922), an overall floor plan for the integrated circuit is constructed and analyzed for timing and top-level routing. Exemplary EDA software products from Synopsys, Inc. of Mountain View, Calif. that can be used at this stage include: Astro and IC Compiler products.

During layout implementation (924), the placement (positioning of circuit elements such as transistors or capacitors) and routing (connection of the same by a plurality of conductors) occurs. Exemplary EDA software products from Synopsys, Inc. of Mountain View, Calif. that can be used at this stage include: the Astro and IC Compiler products.

During analysis and extraction (926), the circuit function is verified at the layout level, which permits refinement of the layout design. Exemplary EDA software products from Synopsys, Inc. of Mountain View, Calif. that can be used at this stage include: Astrorail, Primerail, Primetime, and Star RC/XT products.

During physical verification (928), the layout design is checked to ensure correctness for manufacturing constraints such as DRC constraints, electrical constraints, lithographic constraints, and circuitry function matching the HDL design specification. Exemplary EDA software products from Synopsys, Inc. of Mountain View, Calif. that can be used at this stage include the Hercules product.

During resolution enhancement (930), geometric manipulations of the layout are performed to improve manufacturability of the design. Exemplary EDA software products from Synopsys, Inc. of Mountain View, Calif. that can be used at this stage include: Proteus products.

During mask-data preparation (932), the 'tape-out' data for production of masks to produce finished integrated circuits is provided. Exemplary EDA software products from Synopsys, Inc. of Mountain View, Calif. that can be used at this stage include the CATS family of products.

For all of the above mentioned integrated circuit design tools, similar tools from other EDA vendors, such as Cadence, Siemens, other corporate entities or various noncommercial tools from universities, or open source repositories, can be used as an alternative.

Embodiments of the present disclosure can be used during one or more of the above-described stages. Specifically, some embodiments of the present disclosure can be used in EDA software (912).

A storage subsystem is preferably used to store the programs and data structures that provide the functionality of some or all of the EDA tools described herein, and tools applied for development of cells for the library and for physical and logical design using the library. These programs and data structures are generally executed by one or more processors in a manner known to those of ordinary skill in the art.

Emulation Environment Explanation

Figure 10:
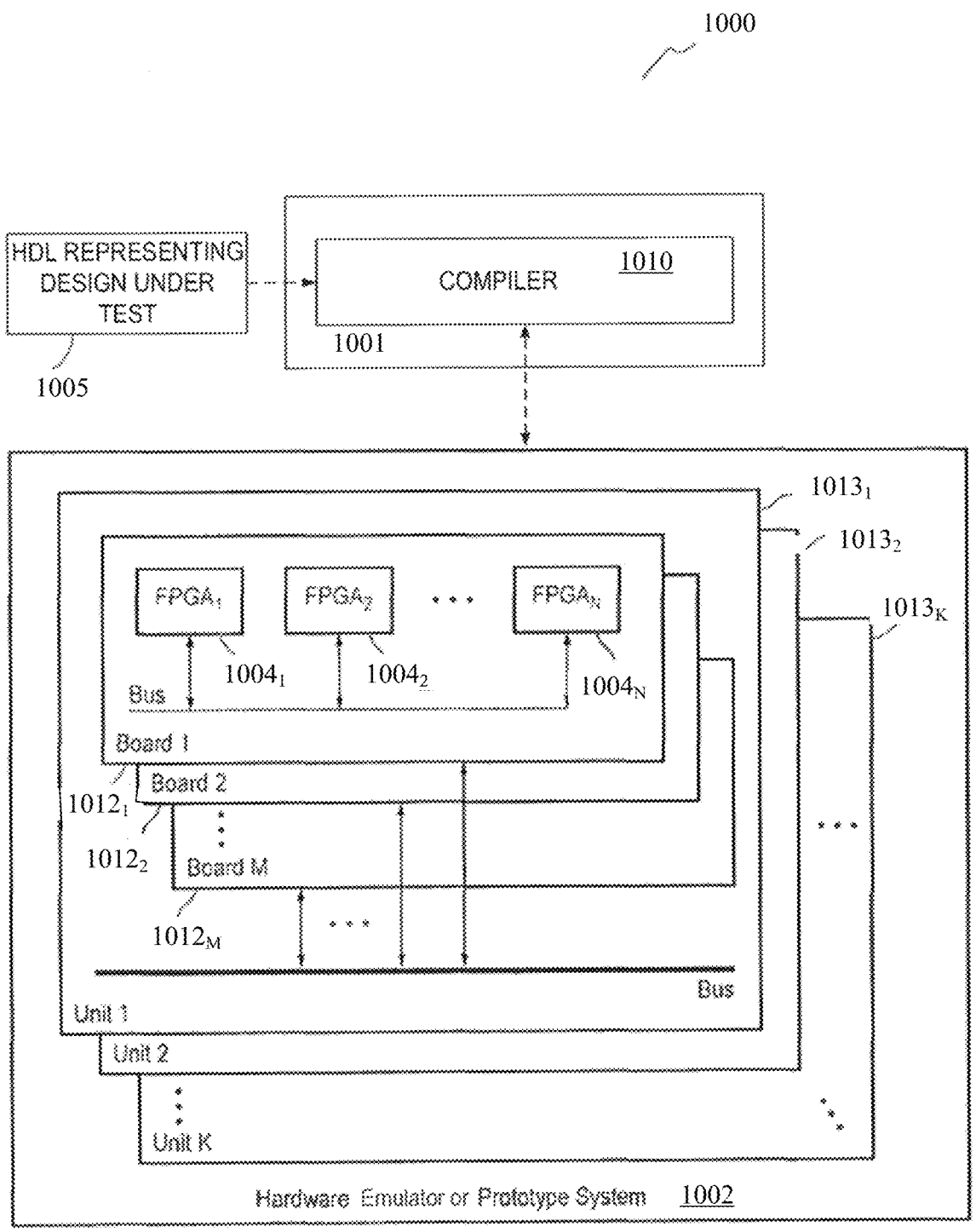
FIG. 10 depicts a typical emulation system which includes a host computer system 1001 (often part of an EDA system) and an emulator system 1002 (typically a set of programmable devices such as Field Programmable Gate Arrays (FPGAs)).

An EDA software system, such as element 912 depicted in FIG. 9 typically includes an emulation system 916 to verify the functionality of the circuit design. FIG. 10 depicts a typical emulation system which includes a host computer system 1001 (often part of an EDA system) and an emulator system 1002 (typically a set of programmable devices such as Field Programmable Gate Arrays (FPGAs)). The host system generates data and information, typically using a compiler 1010, to configure the emulator to emulate a circuit design. One of more circuit designs to be emulated are referred to as a DUT (Design Under Test). The emulator is a hardware system that emulates a DUT, for example, to use the emulation results for verifying the functionality of the DUT. One example of an emulation system that can be used for the embodiments disclosed herein is the ZeBus Server available from Synopsys, Inc.

The host system 1001 comprises one or more processors. In the embodiment where the host system is comprised of multiple processors, the functions described herein as being performed by the host system may be distributed among the multiple processors.

The host system 1001 typically includes a compiler 1010 that processes code written in a hardware description language that represents a DUT, producing data (typically binary) and information that is used to configure the emulation system 1002 to emulate the DUT. The compiler 1010 may transform, change, reconfigure, add new functions to, and/or control the timing of the DUT.

The host system and emulator exchange data and information using signals carried by an emulation connection. The connection can be one or more electrical cables, for example, cables with pin configurations compatible with the RS232 or USB protocols. The connection can be a wired communication medium or network, such as a local area network, or a wide area network such as the Internet. The connection can be a wireless communication medium or a network with one or more points of access, using a wireless protocol such as Bluetooth® or IEEE 802.11. The host system and emulator can exchange data and information through a third device, such as a network server.

The emulator includes multiple FPGAs (or other programmable devices), for example, elements $1004_1$ to $1004_N$ in FIG. 10. Each FPGA can include one or more FPGA interfaces through which the FPGA is connected to other FPGAs of the emulator (and potentially other emulator hardware components), in order for the FPGAs to exchange signals. An FPGA interface may also be referred to as an input/output pin or an FPGA pad. While some embodiments disclosed herein make use of emulators comprising FPGAs, other embodiments can include other types of logic blocks instead of, or along with, the FPGAs for emulating DUTs, for example, custom FPGAs, specialized ASICs for emulation or prototyping, memories, and input/output devices.

A programmable device may include an array of programmable logic blocks and a hierarchy of reconfigurable interconnects that allow the programmable logic blocks to be connected to each other according to the descriptions in the HDL code. Each of the programmable logic blocks can be configured to perform complex combinational functions, or merely simple logic gates, such as AND, and XOR logic blocks.

In many FPGAs, logic blocks also include memory elements, which may be simple latches, flip-flops or more complex blocks of memory. Depending on the length of the interconnections between different logic blocks, signals may arrive at input terminals of the logic blocks at different times.

Programmable processors $1004_1$-$1004_N$ may be placed into one or more hardware boards $1012_1$ through $1012_m$. Many of such boards may be placed into a hardware unit, e.g. $1014_1$. The boards within a unit may be connected using the backplane of the unit or any other types of connections. In addition, multiple hardware units (e.g., $1014_1$ through $1014_K$) may be connected to each other by cables or any other means to form a multi-unit system. In general, the hardware emulation or prototype system 1002 may be formed using a single board, a single unit with multiple boards, or with multiple units without departing from the teachings of the present disclosure.

For a DUT that is to be emulated, the emulator receives from the host system one or more bit files including a description of the DUT. The bit files further specify partitions of the DUT created by the host system with trace and injection logic, mappings of the partitions to the FPGAs of the emulator, and design constraints. Based on the bit files, the emulator configures the FPGAs to perform the functions of the DUT. With some emulators, one or more FPGAs of an emulator already have the trace and injection logic built into the silicon of the FPGA. For this type of emulator, the FPGAs don't have to be configured by the host system to emulate trace and injection logic.

The host system 1001 receives (e.g., from a user) a description of a DUT that is to be emulated. In one embodiment, the DUT description is in a hardware description language (HDL), such as register transfer language (RTL). In another embodiment, the DUT description is in netlist level files, or a mix of netlist level files and HDL files. If part of the DUT description or the entire DUT description is in a HDL, the host system synthesizes the DUT description to create a gate level netlist based on the DUT description. A host system can use the netlist of the DUT to partition the DUT into multiple partitions, with some of these partitions including trace and injection logic. The trace and injection logic traces interface signals exchanged via the interfaces of an FPGA. Additionally, the trace and injection logic can be used to inject traced interface signals into the logic of the FPGA. The host system maps each partition to an FPGA of the emulator. With some emulators, the trace and injection logic is only included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic was incorporated, the bit files also describe the incorporation of the logic. The bit files may also include place and route information and design constraints. The host system stores the bit files and also stores for components of the DUT information describing which FPGAs are to emulate each component of the DUT (to which FPGAs each component is mapped).

Upon request, the host system transmits the bit files to the emulator. The host system instructs the emulator to emulate the DUT. During emulation of the DUT or at the end of the emulation, the host system receives emulation results from the emulator through the emulation connection. Emulation results are data and information generated by the emulator based on the emulation of the DUT. The emulation results include interface signals (states of interface signals) traced by the trace and injection logic of each FPGA. The host system can stores the emulation results, or transmit them to another processing system.

After emulation of the DUT, a user may request to debug a component of the DUT. If such a request is made the user may provide a time period of the emulation to debug. The host system identifies which FPGAs are configured to emulate the component based on the stored information. The host system retrieves stored interface signals associated with the time period and traced by the trace and injection logic of each identified FPGA. The host system instructs the emulator to re-emulate the identified FPGAs, either one by one, multiple at a time, or altogether. The host system transmits the retrieved interface signals to the emulator in order to re-emulate the component for the time period. The trace and injection logic of each identified FPGA injects its respective interface signals received from the host system into the logic of the DUT mapped to the FPGA. In case of multiple re-emulations of an FPGA, the results may be merged all together to have a full debug view.

The host system receives from the emulator signals traced by logic of the identified FPGAs during the re-emulation of the component. The host system stores the signals received from the emulator. The signals traced during the re-emulation can have a higher sampling rate than during the initial emulation. For example, in the initial run a traced signal may be comprised of a saved hardware state every X milliseconds. However, in the re-emulation the traced signal may be comprised of a saved hardware state every Y milliseconds, where Y is less than X. If the user requests to view a waveform of a signal traced during the re-emulation, the host system can retrieve the stored signal and display a plot of the signal (generates a waveform of the signal). Afterwards the user can, for example, request to re-emulate the same component but for a different time period or to re-emulate another component.

A host system typically comprises at least seven subsystems: a design synthesizer, a mapping module, a run time module, a results module, a debug module, a waveform module, and a storage module. Each of these sub-systems may be embodied as hardware, software, firmware, or a combination thereof. Together these components configure the emulator, and monitor the emulation results.

The design synthesizer converts the HDL of a DUT into gate level logic. For a DUT that is to be emulated, the design synthesizer receives a description of the DUT. If the description of the DUT is fully or partially in HDL (e.g., RTL or other level of abstraction), the design synthesizer 1010 synthesizes the HDL of the DUT to create a gate-level netlist with a description of the DUT in terms of gate level logic.

The mapping module partitions DUTs and maps partitions to emulator FPGAs. The mapping module partitions a DUT at the gate level into a number of partitions using the netlist of the DUT. For each partition, the mapping module retrieves a gate level description of the trace and injection logic and incorporates the logic into the partition. As described above, the trace and injection logic included in a partition is configured to trace signals exchanged via the interfaces of an FPGA to which the partition is mapped (trace interface signals). The trace and injection logic can be incorporated into the DUT prior to the partitioning. For example, the trace and injection logic may be incorporated by the design synthesizer prior to or after the synthesizing the HDL of the DUT. Hence, the trace and injection logic may not match the partitions, it may be a subset, a superset or even different from the partitions.

In addition to including the trace and injection logic, the mapping module may include additional tracing logic in a partition in order to trace the states of certain DUT components that are not traced by the trace and injection logic (to trace signals other than the interface signals traced by the trace and injection logic). The mapping module may include the additional tracing logic in the DUT prior to the partitioning or in partitions after the partitioning. The design synthesizer can include the additional tracing logic in an HDL description of the DUT prior to synthesizing the description.

The mapping module maps each partition of the DUT to an FPGA of the emulator. The mapping module performs the partitioning and mapping using design rules, design constraints (e.g., timing or logic constraints), and information about the emulator. For components of the DUT, the mapping module stores information in the storage module describing which FPGAs are to emulate each component.

Based on the partitioning and the mapping, the mapping module generates one or more bit files that describe the created partitions and the mapping of logic to each FPGA of the emulator. The bit files may include additional information, such as constraints of the DUT, and routing information of connections between FPGAs and connections within each FPGA. The mapping module can generate a bit file for each partition of the DUT, which can be stored in the storage module. Upon request from a user, the mapping module transmits the bit files to the emulator, which the emulator uses to configure the FPGAs to emulate the DUT.

If the emulator includes specialized ASICs that include the trace and injection logic, the mapping module may generate a specific configuration allowing to connect them to the DUT or just save the information of what traced/injected signal is and where the information is stored on the specialized ASIC.

The run time module controls emulations performed on the emulator. The run time module may cause the emulator to start or stop executing an emulation. Additionally, the run time module may provide input signals/data to the emulator. The input signals may be provided directly to the emulator through the connection or indirectly through other input signal devices. For example, the host system with the run time module may control an input signal device to provide the input signals to the emulator. The input signal device may be, for example, a test board (directly or through cables), signal generator, another emulator, or another host system.

The results module processes emulation results generated by the emulator. During emulation and/or after completing the emulation, the results module receives emulation results from the emulator generated during the emulation. The emulation results include signals traced during the emulation. Specifically, the emulation results include interface signals traced by the trace and injection logic emulated by each FPGA. The emulation results may also include signals traced by additional logic included in the DUT. Each traced signal can span multiple cycles of the emulation. A traced signal is comprised of multiple hardware states and each hardware state is associated with a time of the emulation. The results module stores the traced signals received in the storage module. For each stored signal, the results module can store information indicating which FPGA generated the traced signal.

The debug module allows users to debug DUT components. After the emulator has emulated a DUT and the results module has received the interface signals traced by the trace and injection logic during the emulation, a user may request to debug a component of the DUT by re-emulating the component for a specific time period. In a request to debug a component, the user identifies the component and indicates a time period of the emulation to debug. The user's request can also include a sampling rate that indicates how often hardware states should be saved by logic that traces signals.

The debug module identifies the one or more FPGAs of the emulator that are configured to emulate the component based on the information stored by the mapping module in the storage module. For each identified FPGA, the debug module retrieves, from the storage module, interface signals traced by the trace and injection logic of the FPGA during the time period indicated by the user (i.e., retrieve hardware states traced by the trace and injection logic that are associated with the time period).

The debug module transmits the retrieved interface signals to the emulator. The debug module instructs the debug module to run the identified FPGAs and for the trace and injection logic of each identified FPGA to inject its respective traced signals into logic of the FPGA in order to re-emulate the component for the requested time period. The debug module can also transmit the sampling rate provided by the user to the emulator so that the tracing logic traces hardware states at the proper intervals.

To debug the component, the emulator only has to run the FPGAs to which the component has been mapped. Additionally, the re-emulation of the component does not have to start from the beginning, but can start at any point desired by the user.

For an identified FPGA, the debug module can transmit instructions to the emulator to load multiple emulator FPGAs with the same configuration of the identified FPGA. The debug module additionally instructs the emulator to run the multiple FPGAs in parallel. Each FPGA from the multiple FPGAs is run with a different time window of the interface signals in order to generate a larger time window in a shorter amount of time. For example, for the identified FPGA to run a certain amount of cycles it may take an hour. However, if multiple FPGAs are loaded with the configuration of the identified FPGA and each of the FPGAs runs a subset of the cycles, it may only take a few minutes for the FPGAs to collectively run all of the cycles.

A user may identify a hierarchy or a list of DUT signals to re-emulate. To enable this, the debug module determines the FPGA needed to emulate the hierarchy or list of signals, retrieves the necessary interface signals and transmits the retrieved interface signals to the emulator for re-emulation. Hence, a user can identify any element (e.g., component or signal) of the DUT to debug/re-emulate.

The waveform module generates waveforms based on traced signals. If a user requests to view a waveform of a signal traced during an emulation run, the host system retrieves the signal from the storage module. The waveform module displays a plot of the signal to the user. For one or more signals, when the signals are received from the emulator, the waveform module can automatically generate the plots of the signals.

Hardware/Software Equivalence

Some of the innovations, embodiments and/or examples described herein comprise and/or use a processor. As used herein, the term 'processor' signifies a tangible data and information processing device that physically transforms data and information, typically using a sequence transformations (also referred to as 'operations'). Data and information can be physically represented by an electrical, magnetic, optical or acoustical signal that is capable of being stored, accessed, transferred, combined, compared, or otherwise manipulated by the processor. The term "processor" can signify a singular processor and multi-core systems or multi-processor arrays, including graphic processing units, digital signal processors, digital processors or combinations of these elements.

The processor can be electronic, for example, comprising digital logic circuitry (for example, binary logic), or analog (for example, an operational amplifier). The processor can also be non-electronic, for example, as seen in processors based on optical signal processing, DNA transformations or quantum mechanics, or a combination of technologies, such as an optoelectronic processor. For data and information structured in binary form, any processor that can transform the data and information using the AND, OR and NOT logical operations (and their derivatives, such as the NAND, NOR, and XOR operations) can transform the data and information using any function of Boolean logic. A processor such as an analog neural network processor can also transform data and information non-digitally. There is no scientific evidence that any of these processors are processing, storing and retrieving data and information, in any manner or form equivalent to the bioelectric structure of the human brain.

The one or more processors may also operate to support performance of the relevant operations in a 'cloud computing' environment or as a 'software as a service' (SaaS). For example, at least some of the operations may be performed by a group of processors available at a distributed or remote system, these processors accessible via a communications network (e.g., the Internet) and via one or more software interfaces (e.g., an application program interface (API).)

As used herein, the term 'module' signifies a tangible data and information processing device that typically is limited in size and/or complexity. For example, the term 'module' can signify one or more methods or procedures that can transform data and information. The term 'module' can also signify a combination of one or more methods and procedures in a computer program. The term 'module' can also signify a small network of digital logic devices, in which interconnections of the logic devices give structure to the network. Methods and procedures comprising a module, specified in a specialized language, such as System C, can be used to generate a specification for a network of digital logic devices that process data and information with exactly the same results as are obtained from the methods and procedures.

A module can be permanently configured (e.g., hardwired to form hardware), temporarily configured (e.g., programmed with software), or a combination of the two configurations (for example, a structured ASIC). Permanently configured modules can be manufactured, for example, using Application Specific Integrated Circuits (ASICs) such as Arithmetic Logic Units (ALUs), Programmable Logic Arrays (PLAs), or Read Only Memories (ROMs), all of which are typically configured during manufacturing. Temporarily configured modules can be manufactured, for example, using Field Programmable Gate Arrays (FPGAs—for example, sold by Xilinx or Intel's Altera), Random Access Memories (RAMs) or microprocessors. A module is configured to process data and information, typically using a sequence transformations (also referred to as 'operations') applied to the data and information (or in the case of ROMs and RAMS, transforming data and information by using the input information as an address for memory that stores output data and information), to perform aspects of the present innovations, embodiments and/or examples of the invention.

Modules that are temporarily configured need not be configured at any one instance in time. For example, a processor comprising one or more modules can have the modules configured at different times. The processor can comprise a set of one or more modules at one instance of time, and to comprise a different set of one or modules at a different instance of time. The decision to manufacture or implement a module in a permanently configured form, a temporarily configured form, or a combination of the two forms, may be driven by cost, time considerations, engineering constraints and/or specific design goals. The "substance" of a module's processing is independent of the form in which it is manufactured or implemented.

As used herein, the term 'algorithm' signifies a process comprising a sequence or set of operations or instructions that a module can use to transform data and information to achieve a result. A module can comprise one or more algorithms. As used herein, the term 'thread' refers to a sequence of instructions that can comprise a subset of the instructions of an entire process or algorithm. A process or algorithm can be partitioned into multiple threads that can be executed in parallel.

As used herein, the term 'computer' includes at least one information processor that, for example, can perform certain operations such as (but not limited to) the AND, OR and NOT logical operations using electronic gates that can comprise transistors, with the addition of memory (for example, memory based on flip-flops using the NOT-AND or NOT-OR operation). Such a processor is said to be Turing-complete or computationally universal. A computer, whether or not it is a digital computer, typically comprises many modules.

As used herein, the term 'software' or 'program' signifies one or more algorithms and data structures that configure a processor for use in the innovations, embodiments and examples described in this specification. Such devices configurable by software include one or more computers, for example, standalone, client or server computers, or one or more hardware modules, or systems of one or more such computers or modules. As used herein, the term "software application" signifies a set of data and instructions that configure the processor to achieve a specific result, for example, to perform word processing operations, or to encrypt a set of data.

As used herein, the term 'programming language' signifies a grammar and syntax for specifying sets of instruction and data that comprise software. Programming languages include assembler instructions, instruction-set-architecture (ISA) instructions, machine instructions, machine dependent instructions, microcode, firmware instructions, state-setting data, or either source code or object code written in any combination of one or more higher level languages, such as conventional procedural programming languages, for example, the "C" programming language or similar programming languages (such as SystemC), or object oriented programming language such as Smalltalk, C++ or the like, and any future equivalent programming languages.

Software is entered into, equivalently, read into, one or memories of the computer or computer system from a data and information storage device. The computer typically has a device for reading storage media that is used to transport the software, or has an interface device that receives the software over a network. This process is discussed in the General Computer Explanation section.

Semantic Support

The signifier 'commercial solution' signifies, solely for the following paragraph, an engineering domain-specific (and thus non-preemptive—see Bilski) electronic structure, process for specified machines, manufacturable circuit (and their Church-Turing equivalents) or composition of matter that is useful in commerce to solve a problem of technology, that is, a use in commerce of an application of science or use in commerce of technology.

The signifier 'abstract' (when used in a patent claim for any embodiments disclosed herein for a new commercial solution that is a scientific application of one or more laws of nature {see Benson}, and that solves a problem of technology {see Diehr} used in commerce—or improves upon an existing commercial solution {see Diehr})—is precisely defined by the inventor(s) {see MPEP 2111.01} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is "difficult to understand" {see Merriam-Webster definition for 'abstract'} how the commercial solution differs from equivalent prior art solutions; or b) a new commercial solution is 'abstract' if it is obvious, that is, if the existing prior art includes at least one analogous prior art solution {see KSR}, or the existing prior art includes at least two prior art items that can be combined {see Alice} by a person having ordinary skill in the art {a "PHOSITA", see MPEP 2141-2144} to be equivalent to the new commercial solution, and is thus unpatentable under 35 U.S.C. 103, for example, because it is "difficult to understand" how the new commercial solution differs from a PHOSITA-combination/-application of the existing prior art; or c) a new commercial solution is 'abstract' if it is not disclosed with an enabling description either because there is insufficient guidance in the enabling description, or because only a generic implementation is described {see Mayo} with unspecified elements, parameters or functionality, so that a PHOSITA is unable to instantiate a useful embodiment of the new commercial solution, without, for example, requiring special programming {see Katz} or circuit design to be performed by the PHOSITA), and is thus unpatentable under 35 U.S.C. 112, for example, because it is "difficult to understand" how to use in commerce any embodiment of the new commercial solution.

CONCLUSION

The foregoing Detailed Description signifies in isolation the individual features, structures, functions, or characteristics described herein and any combination of two or more such features, structures, functions or characteristics, to the extent that such features, structures, functions or characteristics or combinations thereof are based on the present specification as a whole in light of the knowledge of a person skilled in the art, irrespective of whether such features, structures, functions or characteristics, or combinations thereof, solve any problems disclosed herein, and without limitation to the scope of the claims. When an embodiment of a claimed invention comprises a particular feature, structure, function or characteristic, it is within the knowledge of a person skilled in the art to use such feature, structure, function, or characteristic in connection with other embodiments whether or not explicitly described, for example, as a substitute for another feature, structure, function or characteristic.

In view of the foregoing Detailed Description it will be evident to a person skilled in the art that many variations may be made within the scope of innovations, embodiments and/or examples, such as function and arrangement of elements, described herein without departing from the principles described herein. One or more elements of an embodiment may be substituted for one or more elements in another embodiment, as will be apparent to those skilled in the art. The embodiments described herein are chosen to signify the principles of the invention and its useful application, thereby enabling others skilled in the art to understand how various embodiments and variations are suited to the particular uses signified.

The foregoing Detailed Description of innovations, embodiments, and/or examples of the claimed inventions has been provided for the purposes of illustration and description. It is not intended to be exhaustive nor to limit the claimed inventions to the precise forms described, but is to be accorded the widest scope consistent with the principles and features disclosed herein. Obviously, many variations will be recognized by a person skilled in this art. Without limitation, any and all equivalents described, signified or incorporated by reference in this patent application are specifically incorporated by reference into the description herein of the innovations, embodiments and/or examples. In addition, any and all variations described, signified or incorporated by reference herein with respect to any one embodiment are also to be considered taught with respect to all other embodiments. Any such variations include both currently known variations as well as future variations, for example any element used herein includes a future equivalent element that provides the same function, regardless of the structure of the future equivalent.

It is intended that the scope of the claimed inventions be defined and judged by the following claims and equivalents. The following claims are hereby incorporated into the Detailed Description, with each claim standing on its own as a separate embodiment. Disclosed embodiments can be described with more features than are expressly recited in the claims.

What is claimed is:

1. An integrated circuit device comprising:
a semiconductor having, in successively adjacent longitudinal sequence, first, second and third lengths all having a same first conductivity type, the longitudinal sequence defining a direction of current flow, longitudinal sequence having a source end adjacent to the first length and a drain end adjacent to the third length;
a first gate conductor overlying the second length and defining a first body region, the first gate conductor not aligned with any part of the first length of the semiconductor; and
a second gate conductor overlying a cascode portion of the third length and defining a second body region, the second gate conductor being longitudinally shorter than the third length and spaced from the drain end;
wherein the first body region has a cross-sectional area orthogonally to the direction of current flow that is smaller than that of a source region having the first length and that of a drain region having the third length of the semiconductor,
wherein the semiconductor is a nanowire, the first gate conductor wrapping entirely around the first body region.

2. The device of claim 1, wherein the second gate conductor is longitudinally continuous with the first gate conductor.

3. The device of claim 1, wherein the second gate conductor is connected to the first gate conductor.

4. The device of claim 3, wherein the device has an on state and an off state,
and wherein the device is in the off state when (a) there is a non-zero voltage difference between the source end and the drain end and (b) there is zero voltage difference between the first gate conductor and the source end.

5. The device of claim 3, further comprising a source terminal connected to the source end, a drain terminal connected to the drain end, and a gate terminal connected to the first or second gate conductor.

6. The device of claim 3, wherein the first conductivity type is N-type,
and wherein the device has a positive threshold voltage.

7. The device of claim 3, wherein the first conductivity type is P-type,
and wherein the device has a negative threshold voltage.

8. The device of claim 1, wherein the second gate conductor wraps entirely around the second body region.

9. The device of claim 1, wherein the second body region has a fin structure, the second gate conductor covering at least two non-coplanar surfaces of the second body region.

10. The device of claim 9, wherein the first gate conductor covers at least two non-coplanar surfaces of the first body region.

11. The device of claim 1, wherein the first conductivity type is N-type.

12. The device of claim 1, wherein the first body region has a thickness within a range of 1 nm to 10 nm,
and wherein the second body region has a thickness that is at least 1 nm larger than the thickness of the first body region.

13. The device of claim 12, wherein the first gate conductor has a work function between 4.1 and 5.2 eV, inclusive,
and wherein the first body region is doped to a carrier concentration within a range of $10^{18}$ to $10^{21}$ cm$^{-3}$.

14. The device of claim 1, wherein the second length is between 1 nm and 10 nm long, inclusive, and the cascode portion of the third length is between 1 nm and 20 nm long, inclusive.

15. An integrated circuit device, being a planar silicon on insulator device, comprising:
a semiconductor having, in successively adjacent longitudinal sequence, first, second and third lengths all having a same first conductivity type, the longitudinal sequence defining a direction of current flow, longitudinal sequence having a source end adjacent to the first length and a drain end adjacent to the third length;

a first gate conductor overlying the second length and defining a first body region, the first gate conductor not aligned with any part of the first length of the semiconductor; and a second gate conductor overlying a cascode portion of the third length and defining a second body region, the second gate conductor being longitudinally shorter than the third length and spaced from the drain end;

wherein the first body region has a cross-sectional area orthogonally to the direction of current flow that is smaller than that of a source region having the first length and that of a drain region having the third length of the semiconductor, wherein the first, second and third lengths of the semiconductor are formed in a layer overlying an insulating layer, which overlies a substrate.

16. A method for making an integrated circuit device including (i) a semiconductor having, in successively adjacent longitudinal sequence, first, second and third lengths all having a same first conductivity type, the longitudinal sequence defining a direction of current flow, longitudinal sequence having a source end adjacent to the first length and a drain end adjacent to the third length, (ii) a first gate conductor overlying the second length and defining a first body region, the first gate conductor not aligned with any part of the first length of the semiconductor, and (iii) a second gate conductor overlying a cascode portion of the third length and defining a second body region, the second gate conductor being longitudinally shorter than the third length and spaced from the drain end, wherein the first body region has a cross-sectional area orthogonally to the direction of current flow that is smaller than that of a source region having the first length and that of a drain region having the third length of the semiconductor, the method comprising:

providing the semiconductor having, in successively adjacent longitudinal sequence, first, second and third lengths all having the same first conductivity type, the longitudinal sequence defining a direction of current flow, longitudinal sequence having a source end adjacent to the first length and a drain end adjacent to the third length;

forming the first gate conductor overlying the second length and defining the first body region, the first gate conductor not aligned with any part of the first length of the semiconductor;

forming the second gate conductor overlying a cascode portion of the third length and defining the second body region, the second gate conductor being longitudinally shorter than the third length and spaced from the drain end; and recessing the first body region so as to have a cross-sectional area orthogonally to the direction of current flow that is smaller than that of the source region having the first length and that of the drain region having the third length of the semiconductor, wherein the semiconductor is a nanowire, the first gate conductor wrapping entirely around the first body region.

17. The method of claim 16, wherein providing a semiconductor comprises providing a lateral nanowire semiconductor.

18. The method of claim 16, wherein providing a semiconductor comprises providing the semiconductor on an insulating layer, which is itself formed in a layer overlying a substrate.

19. The method of claim 16, wherein proving a semiconductor comprises providing a fin-shaped semiconductor.

20. The method of claim 16, further comprising forming a gate dielectric overlying the second length, the first gate conductor being formed over the gate dielectric.

21. The method of claim 16, wherein recessing the first body region occurs prior to forming a first gate conductor.

22. The method of claim 16, wherein providing a semiconductor comprises providing a vertical nanowire having a first semiconductor material in the first length, a second semiconductor material in the second length, and a third semiconductor material in the third length, and wherein recessing the first body region comprises etching or oxidizing the second semiconductor material preferentially relative to the first and third materials.

* * * * *